(12) United States Patent
Perthold

(10) Patent No.: US 10,256,857 B2
(45) Date of Patent: Apr. 9, 2019

(54) RECEIVER

(71) Applicant: Innovationszentrum für Telekommunikationstechnik GmbH IZT, Erlangen (DE)

(72) Inventor: Rainer Perthold, Weisendorf (DE)

(73) Assignee: Innovationszentrum fur Telekommunikationstechnik GmbH IZT, Erlangen (DE)

( * ) Notice: Subject to any disclaimer, the term of this patent is extended or adjusted under 35 U.S.C. 154(b) by 0 days.

(21) Appl. No.: 15/951,813

(22) Filed: Apr. 12, 2018

(65) Prior Publication Data

US 2018/0234124 A1  Aug. 16, 2018

Related U.S. Application Data

(63) Continuation of application No. PCT/EP2016/073798, filed on Oct. 5, 2016.

(30) Foreign Application Priority Data

Oct. 12, 2015  (DE) .......................... 10 2015 219 739

(51) Int. Cl.
*H04B 1/10*  (2006.01)
*H03M 1/12*  (2006.01)
(Continued)

(52) U.S. Cl.
CPC .......... *H04B 1/1036* (2013.01); *H03M 1/121* (2013.01); *H04B 1/0057* (2013.01); *H04L 27/2649* (2013.01); *H04B 2001/1054* (2013.01)

(58) Field of Classification Search
CPC ................ H04B 1/1036; H04B 1/0057; H04B 2001/1054; H04L 27/2649; H03M 1/121
(Continued)

(56) References Cited

U.S. PATENT DOCUMENTS 5,392,044 A * 2/1995 Kotzin .................. H03M 1/121
341/155
2006/0109939 A1* 5/2006 Ciccarelli ............ H03G 3/3052
375/350
(Continued)

FOREIGN PATENT DOCUMENTS

DE  102006029482 A1  6/2006
EP     2191579 B1  9/2008
(Continued)

*Primary Examiner* — Dhaval V Patel
(74) *Attorney, Agent, or Firm* — Michael A. Glenn; Perkins Coie LLP

(57) ABSTRACT

A receiver for receiving an analog signal having a frequency band to be digitalized has a filter unit having at least two filters for at least two receive paths, an AD converter per receive path, and digital signal processing. The filters are coupled to a common signal source in order to obtain the analog signal having the frequency band to be digitalized, and configured to divide the frequency band to be digitalized into at least two sub-bands for the at least two receive paths. The analog-to-digital converters are configured to digitalize the signals of the at least two sub-frequency bands. The digital signal processing is coupled to the at least two analog-to-digital converters in order to obtain the at least two digitalized signals and merge the at least two signals to be digitalized. The at least two filters, with regard to their filter characteristics, are configured such that the at least two sub-frequency bands have a relative bandwidth of <1:2.

17 Claims, 3 Drawing Sheets

(51) Int. Cl.
*H04B 1/00* (2006.01)
*H04L 27/26* (2006.01)

(58) Field of Classification Search
USPC ..... 375/350, 321, 316, 348, 285; 455/226.1, 455/307
See application file for complete search history.

(56) References Cited

U.S. PATENT DOCUMENTS

2007/0110198 A1 5/2007 Skarby et al.
2010/0048157 A1 2/2010 Carrera et al.
2011/0053538 A1* 3/2011 Armitage ............ H04B 1/1027
455/226.1

FOREIGN PATENT DOCUMENTS

| EP | 2377249 B1 | 1/2010 |
| EP | 2403145 A1 | 7/2010 |
| WO | 2009036981 A1 | 9/2008 |

* cited by examiner

| filter no. | filter bank | start frequency/ MHz | stop frequency/ MHz |
| --- | --- | --- | --- |
| 1 | A | 0 | 1,5 |
| 2 | B | 1,3 | 2 |
| 3 | A | 1,6 | 2,6 |
| 4 | B | 2,1 | 3,4 |
| 5 | A | 2,8 | 4,5 |
| 6 | B | 3,7 | 5,9 |
| 7 | A | 4,8 | 7,7 |
| 8 | B | 6,3 | 10,1 |
| 9 | A | 8,3 | 13,3 |
| 10 | B | 10,9 | 17,4 |
| 11 | A | 14,3 | 22,8 |
| 12 | B | 18,8 | 30 |

Fig. 2b

RECEIVER

CROSS-REFERENCE TO RELATED APPLICATIONS

This application is a continuation of copending International Application No. PCT/EP2016/073798, filed Oct. 5, 2016, which is incorporated herein by reference in its entirety, and additionally claims priority from German Application No. 10 2015 219 739.5, filed Oct. 12, 2015, which is also incorporated herein by reference in its entirety.

BACKGROUND OF THE INVENTION

Embodiments of the present invention relate to a receiver for receiving an analog signal, like a high-frequency signal, having a frequency band to be digitalized.

Such a receiver may, for example, be employed as a radio receiver or measuring receiver, in particular when radio or measuring signals are to be detected in high quality over a relatively high bandwidth. In a frequency range having a great frequency width, like in the frequency range below 30 MHz, high powers may occur at the antenna output, in particular with large receive antennas, depending on the conditions of propagation. Typically, this means a limitation of the bandwidth at the input of the receiver. Additionally, so-called intermodulation products of different orders may form. Second-order intermodulation products are particularly critical.

There are already some known approaches, like using filter stages at the input of the radio receiver. This is referred to as pre-selection and aims at preventing false reception, like at the so-called mirror frequency, or limiting the ingoing power. This approach is employed in both classic analog receive architectures, like superheterodyne receivers, and receivers where intermediate frequencies are digitalized.

In high-quality receivers, the relative bandwidth of the pre-selection filter advantageously is selected to be smaller than 1:2. This is referred to as the so-called sub-octave filter criterion. Using such sub-octave filters, it is possible to reduce second-order intermodulation products which may form in downstream stages.

In particular with low receive frequencies (like short waves of up to 30 MHz) and digital receivers, pre-selection is considerably narrower than the real-time bandwidth which would be possible from the point of view of a downstream analog-to-digital converter employed. This restricts the usability of the receiver considerably.

One prior-art approach is either switching the pre-selection filter in correspondence with the desired receive frequencies or adjusting the bandwidth of the filters to the receive conditions. Switching is, for example, discussed in EP 2 377 249 B1 using a radio signal receiver. Additionally, EP 2 191 579 B1 shows a device and a method for receiving an information signal having an information signal spectrum where the bandwidth of the filters are adjusted in correspondence with receive conditions. Due to this adjustment or, in particular, with bandwidths of greater than 1:2, however, the advantages for second-order intermodulation products vanish so that only the signal energy can be reduced. Therefore, there is need for an improved approach.

The object underlying the present invention is providing a concept which allows receiving and digitalizing an analog signal, comprising a frequency band to be digitalized having a large bandwidth, while avoiding or reducing intermodulation products (like of second order).

SUMMARY

According to an embodiment, a receiver for receiving an analog signal having a frequency band to be digitalized may have: a filter unit having at least two filters for at least two receive paths coupled to a common signal source in order to obtain the analog signal having the frequency band to be digitalized, and configured to divide the frequency band to be digitalized into at least two sub-bands for the at least two receive paths; an analog-to-digital converter per receive path, configured to digitalize the signals of the at least two sub-bands; and digital signal processing coupled to the at least two analog-to-digital converters of the at least two receive paths to obtain the at least two digitalized signals, and configured to merge the at least two digitalized signals; characterized in that the at least two filters, with regard to their filter characteristic, are implemented such that the at least two sub-bands have a mutual relative bandwidth of smaller than 1:2 so that the two filters are implemented with a change in filter bandwidth relative to the bandwidth of a neighboring filter of the at least two filters.

According to another embodiment, a method for receiving an analog signal having a frequency band to be digitalized may have the steps of: dividing the frequency band to be digitalized into at least two sub-bands by means of a filter unit having at least two filters for at least two receive paths, wherein the at least two filters are coupled to a common signal source in order to obtain the analog signal having the frequency band to be digitalized; digitalizing, per receive path, the signals of the at least two sub-bands by means of an analog-to-digital converter per receive path; and merging the at least two digitalized signals by means of digital signal processing coupled to the at least two analog-to-digital converters of the at least two receive paths in order to obtain the at least two digitalized signals, characterized in that the at least two filters, with regard to their filter characteristics, are implemented such that the sub-bands have a mutual relative bandwidth of smaller than 1:2 so that the two filters are implemented with a change in filter bandwidth relative to the bandwidth of a neighboring filter of the at least two filters.

Another embodiment may have a non-transitory digital storage medium having stored thereon a computer program for performing a method for receiving an analog signal having a frequency band to be digitalized, having the steps of: dividing the frequency band to be digitalized into at least two sub-bands by means of a filter unit having at least two filters for at least two receive paths, wherein the at least two filters are coupled to a common signal source in order to obtain the analog signal having the frequency band to be digitalized; digitalizing, per receive path, the signals of the at least two sub-bands by means of an analog-to-digital converter per receive path; and merging the at least two digitalized signals by means of digital signal processing coupled to the at least two analog-to-digital converters of the at least two receive paths in order to obtain the at least two digitalized signals, characterized in that the at least two filters, with regard to their filter characteristics, are implemented such that the sub-bands have a mutual relative bandwidth of smaller than 1:2 so that the two filters are implemented with a change in filter bandwidth relative to the bandwidth of a neighboring filter of the at least two filters, when the program runs on a computer.

Embodiments of the present invention provide a receiver for receiving an analog signal having a frequency band to be digitalized. The receiver comprises a filter unit for at least two receive paths, an analog-to-digital converter per receive path, and digital signal processing. The filter unit comprises at least two filters for the at least two receive paths coupled to a common signal source, like an antenna, in order to obtain the analog signal having the frequency band to be digitalized. The filters are configured to divide the frequency band to be digitalized into at least two sub-bands for the at least two receive paths. The analog-to-digital converters of the at least two receive paths are configured to digitalize the signals of the at least two sub-bands. The digitalized signals are then merged in digital signal processing. Here, digital signal processing is coupled to the at least two analog-to-digital converters in order to obtain the at least two digitalized signals, and configured for merging the signals in the digital range. In addition, the at least two filters are selected, relative to their filter characteristics, such that the at least two sub-frequency bands comprise a relative bandwidth of <1:2. Here, so-called sub-octave filters or filters having a so-called sub-octave filter characteristic may be used.

Embodiments of the present invention are based on the finding that intermodulation products (in particular of second order) at the receiver input can be reduced effectively by means of selecting a sufficiently narrow filter or a plurality of sufficiently narrow filters arranged to form a filter unit. In order to make use of this effect for the entire filter width, the individual narrow-band filters are connected to form a filter unit or to form two filter banks such that the plurality of filters covers the entire frequency band to be digitalized as far as possible. Due to the fact that each filter is coupled directly to an AD converter, digitalization is performed per sub-frequency band so that, subsequently, the individual sub-bands can be merged again in a digital signal processing stage with no losses to form an overall signal. Consequently, very good IP2 values, which evaluate the resulting second-order intermodulation products, can be achieved on the one hand. Secondly, the signal losses are minimal, since there are no losses, in particular when merging.

In correspondence with further embodiments, so-called sub-octave filters or filter having a sub-octave filter characteristic are employed as filters. Filters having a sub-octave filter characteristic are particularly defined in that they fulfill the so-called sub-octave criterion, i.e. have a relative bandwidth of <1:2. This sub-octave filter characteristic is of particular advantage with regard to intermodulation products, which will be discussed later.

In accordance with embodiments, the filter unit comprises more than two, i.e., for example, three or even more filters for three or more receive paths. Here, the sub-frequency bands arranged directly next to one another may overlap partly, wherein advantageous sub-frequency bands do not overlap with a sub-frequency band therebetween. In accordance with embodiments, this is realized by grouping the plurality of filters to form two filter banks connected in parallel, wherein two filters in one of the two filter banks having center frequencies following directly one after the other, with regard to the bandwidth, are configured such that the resulting sub-bands of the first one of the two filter banks do not overlap, wherein a filter of the second one of the two filter banks, with regard to its center frequency, is located therebetween and configured to be overlapping in bandwidth with the two filters of the first filter bank.

Starting from an exemplary, but advantageous embodiment where the relative filter bandwidth change (i.e. change in filter bandwidth relative to the bandwidth of the neighboring filter) for the three or more filters of the two filter banks is approximately equal (i.e. +/−30%), the filters exemplarily are to be configured as follows. The relative bandwidth of the filters is in a range from 1.4 to 1.6, wherein the center frequencies increase by a factor from the range from 1.2 to 1.4.

In accordance with further embodiments, the filter unit may also comprise a low-pass filter which comprises the lowest center frequency when compared to the at least two filters.

It is to be mentioned here that, in accordance with embodiments, the filters are implemented to be purely passive elements. In accordance with embodiments, the plurality of filters or the two filter banks here can be connected to the signal source, like, for example, the antenna, or, generally, an input, via a common power divider. Such filter bands may be realized at low introduction attenuation and reactive power dividers (attenuation factor <3 dB). It is of advantage here that active elements upstream of the filters, for example, may be dispensed with completely. Electronic switches may also be omitted. Due to these measures, the IP2 values can be improved further. Another advantage is that the sensor is well protected from excess voltages by means of the passive filter network. It is to be mentioned here also that the passive filters for the filter unit keep the complexity thereof very small, in particular when compared to switchable or running pre-selection.

Each receive path may optionally be equipped with an amplifier and/or an automatic amplifier control. Here, the amplifier and/or the amplifier in combination with the automatic amplifier controller are/is arranged between the filter of the receive path and the respective AD converter.

In accordance with further embodiments, the digital signal processing may be implemented to be an FPGA which merges all the digital signals of the individual signal paths. In addition to digital lossless merging, it may also optionally perform level adjustments for the individual sub-bands.

Further embodiments provide a method for receiving an analog signal having a frequency band to be digitalized. The method comprises the steps of dividing the frequency band to be digitalized into at least two sub-bands, digitalizing, per receive path, the signals of the at least two sub-bands, and merging the at least two digitalized signals. The filters for dividing are selected as has been discussed above.

BRIEF DESCRIPTION OF THE DRAWINGS

Embodiments of the present invention will be discussed in greater detail below referring to the appended drawings, in which:

FIG. 2b shows a table of exemplary values for dimensioning the corresponding filter banks applied in embodiments.

DETAILED DESCRIPTION OF THE INVENTION

Figure 1:
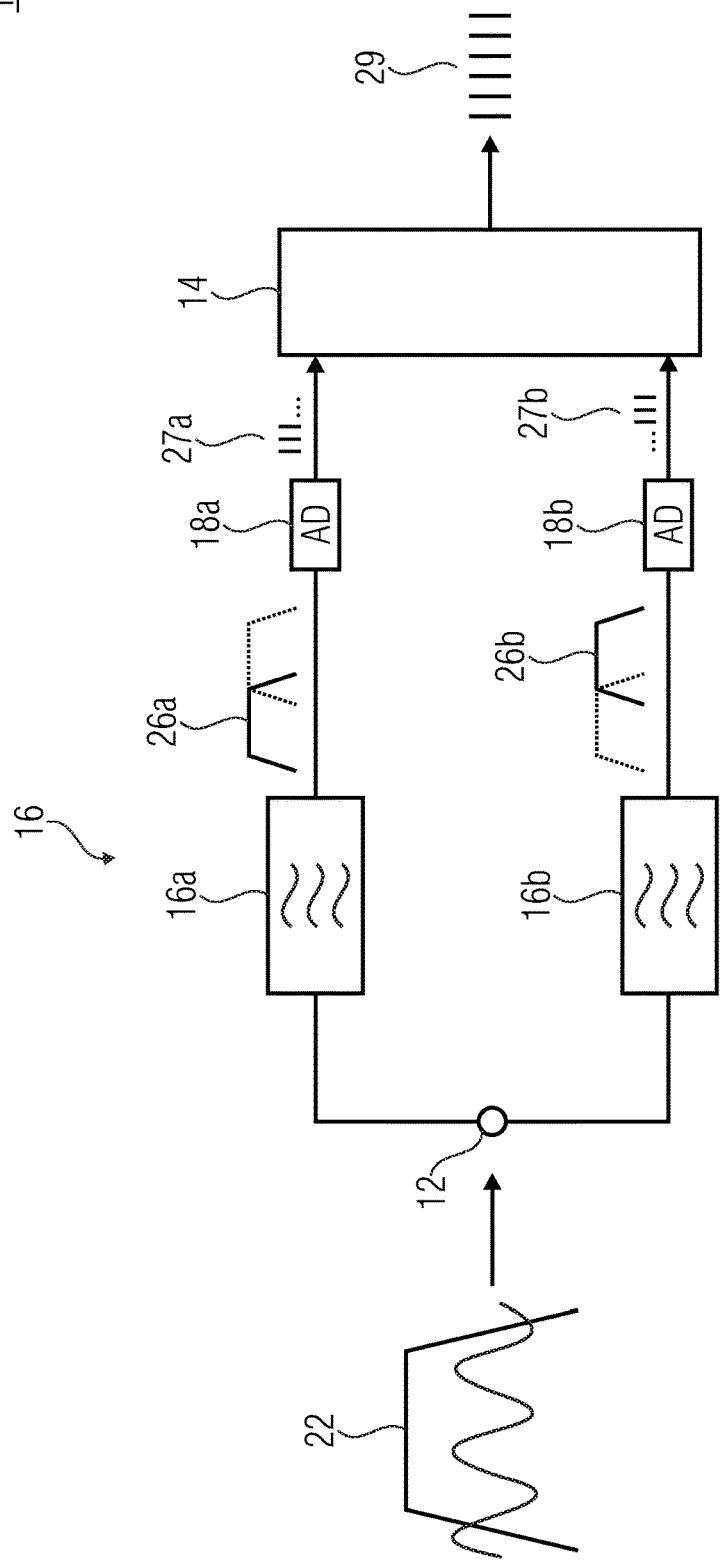
FIG. 1 shows a block circuit diagram of a receiver having two signal paths in accordance with a basic embodiment.

Before discussing below in greater detail embodiments of the present invention referring to the appended drawings, it is to be pointed out that equal elements or structures are provided with equal reference numerals so that the description thereof is mutually applicable or exchangeable.

FIG. 1 shows a receiver 10, like a radio receiver, comprising a common input 12, digital signal processing 14 which here represents the output of the receiver. In this embodiment, two signal paths, characterized by letters a and b, are provided between the input 12 which may exemplarily be an antenna or, generally, a signal input or coupled to an antenna, and the digital signal processing 14.

Every signal path a and b comprises a filter 16a and 16b, respectively, like an analog filter 16a and 16b, and an analog-to-digital converter 18a and 18b, respectively. The filters 16a and 16b together form the filter unit 16. All the filters 16a and 16 of the filter unit 16 are connected to the common input 12 or common node point 12.

The effect of this is that each signal path a and b receives the same signal 22 having the full frequency band from the common node point 12. The signal applied to the input is an analog signal comprising a frequency band 22 to be digitalized. This frequency band 22 to be digitalized is divided by the filters 16a and 16b, or the filter unit 16, into the sub-frequency bands 26a and 26b at the output of the filters 16a and 16b. Consequently, the analog-to-digital converters 18a and 18b do no longer receive the full frequency band 22 to be digitalized, but only the individual sub-frequency bands 26a and 26b. Each of this sub-bands 26a and 26b is then digitalized by means of the specific AD converter 18a and 18b (cf. signals 27a and 27b).

In the downstream digital signal processing 14, the sub-bands 26a and 26b can be merged again completely or with no gaps therebetween. The method of merging is known in the art and described, for example, in EP 2 377 249 B1 or EP 2 191 579 B1. The (digital) combined signal 29 which comprises the entire signal band to be digitalized, is then passed on to a further unit (not illustrated) in the combined form. Evaluating the data does not have to take into consideration filter boundaries, since the frequency bands were merged before with not gaps therebetween in the signal processing. Here, a conventional network or also an optical network can be used, as is illustrated using the arrow at the output of the digital signal processing 14.

Here, filtering by the filter unit 16 takes place such that the sub-frequency bands 26a and 26b comprises a relative bandwidth of <than 1:2, that it fulfill the sub-octave filter criterion. The background of this is that intermodulation products will form if at least two frequency bands in a system are processed in parallel, wherein there will be non-linear transfer functions. If two different frequencies, like the at least two center frequencies, for example, are guided through the receiver, the result will be second-order intermodulation products:

$f_1+f_2$ and $f_1-f_2$.

In order to prevent the intermodulation products from summing up, the corresponding filter bandwidths are selected to be relatively narrow, wherein relatively narrow is to be related to the center frequency of the respective sub-band. It has shown that a relative filter bandwidth, which corresponds to the sub-octave characteristic, i.e. smaller than a ratio of 1:2, like 1:1.5 or 1:1.35, for example, is suitable to weaken input signals outside this frequency range of interest such that the second-order intermodulation products thereof, within the passband, are reduced to the same extent. A relative filter bandwidth of 1.6, for example, or, generally, a range from 1.4 to 1.6 or 1.2 to 1.8 fulfills this sub-octave criterion. The center frequencies of each filter increase from one filter to the next of the filter unit 16. In general, the relative bandwidth is selected to be smaller than 1:2, whereas the center frequencies increase in a corresponding absolute way.

Subsequently, starting from these basic embodiments having two receive paths a and b, an embodiment having an overall number of 12 receive paths is shown below.

Figure 2A:
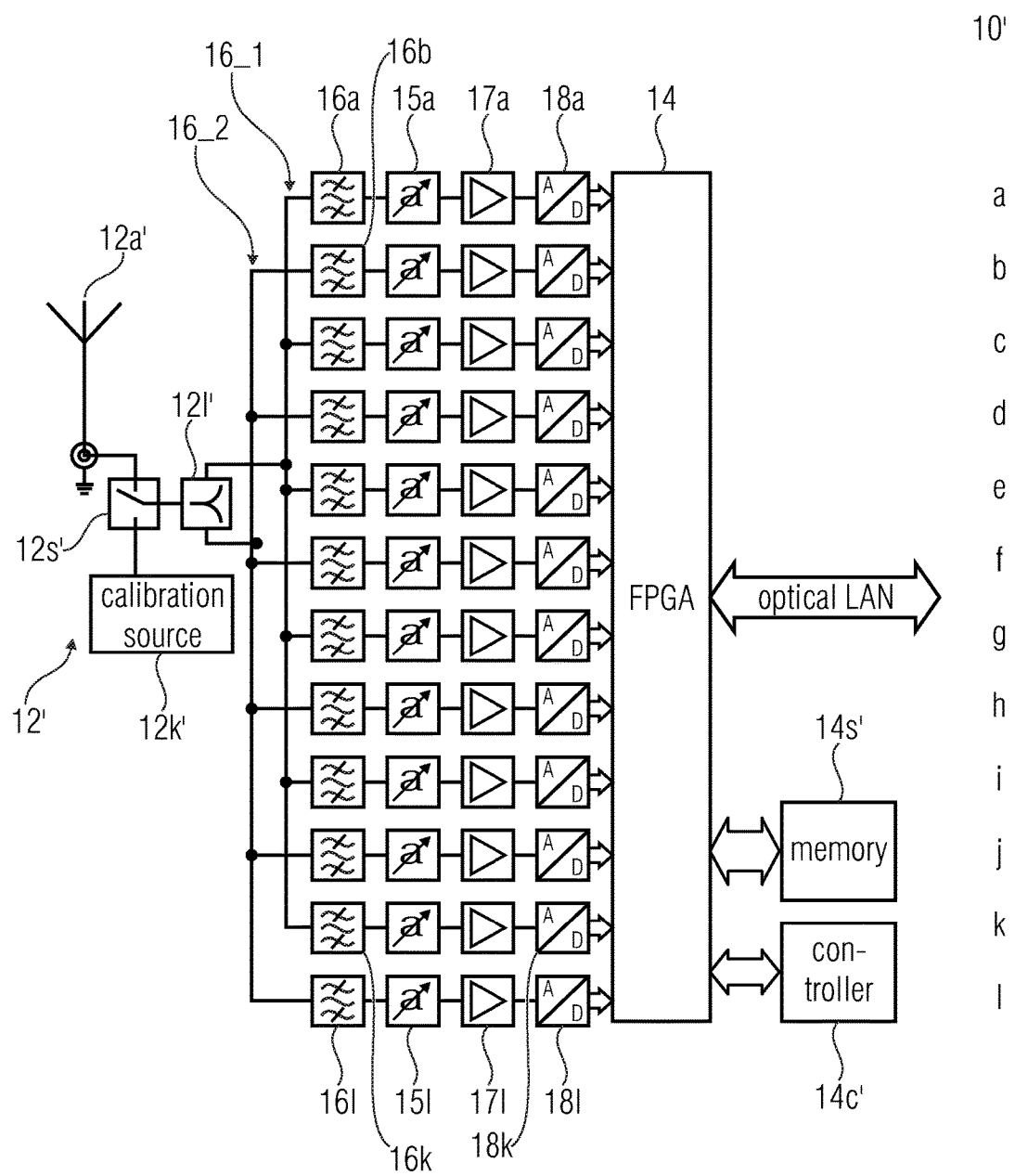
FIG. 2a shows a block circuit diagram of a receiver having a plurality of receive paths, which are interconnected via two filter banks, in accordance with an extended embodiment.

FIG. 2a shows the receiver 10' comprising an input 12' and a digital signal processing stage 14. An overall number of 12 signal paths A to L is provided between the input 12' and the digital signal processing stage 14.

The 12 signal paths a to l of the receiver 10' comprise the filters 16a to 16l, respectively, of the filter stage 16, and the analog-to-digital converters 18a to 18l, respectively. In this embodiment, amplifier elements 17a to 17l are provided on the input side relative to the analog-to-digital converters 18a to 18l between the filters 16a to 16l and the analog-to-digital converters 18a to 18l. These serve for adjusting the signal to be output by the respective filters 16a to 16l in the respective sub-bands relative to their amplitude so that an effective analog-to-digital conversion can be performed by the analog-to-digital converters 18a to 18l. In order to efficiently regulate modulation of the respective amplifier elements 17a to 17l, in correspondence with further embodiments, an automatic amplifier controller 15a to 15l may be connected upstream of the respective amplifiers 17a to 17l.

On the input side, the filters 16a to 16l of the filter stage 16 (filter unit) are all connected to a node point which here is realized by a power divider 121'. The power divider 121' is coupled with its input to the antenna 12a'. Looking at it from the other side, this means that the power divider 121' is connected between the antenna input and the filter unit 16 which, as is illustrated here, may consist of several filter banks. The power divider 121' ensures sufficient isolation (like 20 dB or more, for example) between the ports for the different filter banks 16_1 and 16_2, which will be discussed below in greater detail. The background here is that the different filter banks 16_1 and 16_2 are not to influence each other.

As has already been indicated, in accordance with embodiments (and as is illustrated here), on the output side, the power divider 121' comprises two outputs (ports), wherein the filters 16a, 16c, 16e, 16g, 16i and 16k (first filter bank 16_1) are coupled in at a first output, wherein the filters 16b, 16d, 16f, 16h, 16j and 16l (second filter bank 16_2) are supplied by the second output of the power divider 12l'. The background of this is that, in accordance with embodiments, the filter unit 16 is subdivided into two different filter banks 16_1 and 16_2, wherein the transmission characteristics of the respective second filters 16a, 16c, 16e, 16g, 16i and 16k, i.e. the filters of the first filter bank 16_1, and the filters 16b, 16d, 16f, 16h, 16j and 16l, i.e. the filters of the second filter bank 16_2, are not mutually overlapping, whereas the transmission characteristics of the filters, which are directly adjacent to one another, belonging to the two different filter banks 16_1 and 16_2, like 16ab or 16bc or 16cd, for example, etc., are arranged to be overlapping, as will be discussed below referring to the table of FIG. 2b. Due to the fact that the filters 16a, 16c, 16e, 16g, 16i and 16k and the filters 16b, 16d, 16f, 16h, 16j and 16l of a filter bank 16_1 and 16_2 (i.e. the filters 1/3/5/7/9/11 and 2/4/6/8/10/12 of FIG. 2b) do not overlap, it is made possible that the filters 16a to 16l on the input side are coupled in a purely reactive manner with low losses only.

In accordance with embodiments, the input of the power divider 12' or the common node point of the filter bank 16 may be coupled to the antenna 16a in a switchable manner via a switch 12s', wherein a calibration source 12k' is provided at a second input of the switch 12s'. The background of this is that the paths a to l and also the digital signal processing 14 can be calibrated with a known test signal using the calibration source. Advantageously, but not necessarily, the adjustment determined from the calibration takes place in the digital signal processing 14.

As has been discussed above, the digital signal processing 14, which may, for example, be realized as an FPGA (or alternatively ASIC or in software) is configured to combine the output signals of the analog-to-digital converters 18-18l and optionally compensate for element-caused differences which were determined by means of the calibration source 12k'. These differences may, for example, be stored in an additional memory 14s' for calibration data. In accordance with embodiments, the digital signal processing 14 may be configured to compensate for level differences caused by the automatic amplifier controller (cf. reference numbers 15a to 15l and 17a to 17l). In accordance with further embodiments, the FPGA is programmed or controlled via a controller 14c'.

In accordance with embodiments, the entire desired receive range is received by means of the receivers 10' discussed above via the signal paths a to l, wherein the entire receive range, like 0 to 30 MHz, for example, is divided into the 12 filters. In the example of a receive range from 0 to 30 MHz or, generally, from 0 to x MHz, in accordance with embodiments, the first filter, here the filter 16a, may be implemented not to be a sub-octave filter (i.e. not belonging to the filter bank 16 defined above), but a low-pass filter. The dimensioning of the other 11 filters or, generally, the dimensioning of the 12 filters, will be discussed below referring to FIG. 2b.

FIG. 2b shows a possible dimensioning of a filter unit for a frequency range from 0 to 30 MHz, wherein the start and stop frequencies are indicated for each filter (cf. filters no. 1 to 12). It is also illustrated which filter bank the respective filters 1 to 12 belong to. As has already been discussed before, filter no. 1 is implemented to be a low-pass filter. All the other filters comprise a relative bandwidth of wave 1.6 to one another. The sub-octave criterion is thus met well, except for filter band no. 1. Since the frequency boundaries increase from one filter to the next each only by a factor of wave 1.31, the result is sufficient overlapping of neighboring filters, i.e. filters of different filter bands (cf. ab).

Even when, in the above embodiments, two filters were assumed in the easiest case, wherein one filter bank is formed by one filter, or 12 filters, wherein six filters each belong to one filter bank, it is to be pointed out that the number may vary in correspondence with the desired frequency width to be digitalized. This means that filter units having an overall number of eight filters or even 14 filters or an odd number of filters are conceivable.

Even when the above embodiments were discussed in particular in connection with a device or the receiver 10, 10', it is to be pointed out that further embodiments refer to a corresponding method. The method comprises the steps of:
Dividing the frequency band to be digitalized into at least two sub-bands by means of a filter unit comprising at least two filters for at least two receive paths, wherein the at least two filters are coupled to a common signal source in order to obtain the analog signal having the frequency band to be digitalized.
Digitalizing, per receive path, the signals of the at least two sub-bands by means of an analog-to-digital converter per receive path.
Merging the at least two digitalized signals by means of digital signal processing which is coupled to the at least two analog-to-digital converters of the at least two receive paths in order to obtain the at least two digitalized signals.

The filters are implemented in correspondence with the above dimensioning rules.

Although some aspects have been described in the context of a device, it is clear that these aspects also represent a description of the corresponding method, such that a block or element of am device also corresponds to a respective method step or a feature of a method step. Analogously, aspects described in the context with or as a method step also represent a description of a corresponding block or detail or feature of a corresponding device. Some or all of the method steps may be executed by (or using) a hardware apparatus, like, for example, a microprocessor, a programmable computer or an electronic circuit. In some embodiments, some or several of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray disc, CD, ROM, PROM, EPROM, EEPROM or FLASH memory, a hard drive or another magnetic or optical memory having electronically readable control signals stored thereon, which cooperate or are capable of cooperating with a programmable computer system such that the respective method will be performed. Therefore, the digital storage medium may be computer-readable.

Some embodiments according to the invention include a data carrier comprising electronically readable control signals, which are capable of cooperating with a programmable computer system such that one of the methods described herein will be performed.

Generally, embodiments of the present invention can be implemented as a computer program product with program code, the program code being operative for performing one of the methods when the computer program product runs on a computer. Nowadays, bandwidths around 30 MHz can be in-line-processed in real time on efficient PCs.

The program code may, for example, be stored on a machine-readable carrier.

Other embodiments comprise the computer program for performing one of the methods described herein, wherein the computer program is stored on a machine-readable carrier.

In other words, an embodiment of the inventive method is, therefore, a computer program comprising a program code for performing one of the methods described herein, when the computer program runs on a computer.

A further embodiment of the inventive methods is, therefore, a data carrier (or a digital storage medium or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may, for example, be configured to be transferred via a data communication connection, for example via the Internet.

A further embodiment comprises processing means, for example a computer, or a programmable logic device, configured to or adapted to perform one of the methods described herein.

A further embodiment comprises a computer having installed thereon the computer program for performing one of the methods described herein.

A further embodiment according to the invention comprises a device or a system configured to transfer a computer program for performing at least one of the methods described herein to a receiver. Transmission can be performed electronically or optically. The receiver may, for example, be a computer, a mobile device, a memory device or the like. The device or system may, for example, comprise a file server for transferring the computer program to the receiver.

In some embodiments, a programmable logic device (for example a field-programmable gate array, FPGA) may be used to perform some or all of the functionalities of the methods described herein. In some embodiments, a field-programmable gate array may cooperate with a microprocessor in order to perform one of the methods described herein. Generally, in some embodiments, the methods may be performed by any hardware device. This can be universally applicable hardware, such as a computer processor (CPU), or hardware specific for the method, such as ASIC.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A receiver for receiving an analog signal comprising a frequency band to be digitized, comprising:
   a filter unit comprising at least two filters for at least two receive paths coupled to a common signal source in order to acquire the analog signal comprising the frequency band to be digitized, and configured to divide the frequency band to be digitized into at least two sub-bands for the at least two receive paths;
   an analog-to-digital converter per receive path, configured to digitalize the signals of the at least two sub-bands; and
   digital signal processing coupled to the at least two analog-to-digital converters of the at least two receive paths to acquire the at least two digitalized signals, and configured to merge the at least two digitalized signals;
   wherein the at least two filters, with regard to their filter characteristic, are implemented such that the at least two sub-bands comprise a mutual relative bandwidth of smaller than 1:2 so that the two filters are implemented with a change in filter bandwidth relative to the bandwidth of a neighboring filter of the at least two filters.

2. The receiver in accordance with claim 1, wherein the at least two filters are sub-octave filters and/or comprise a sub-octave filter characteristic.

3. The receiver in accordance with claim 1, wherein the filter unit comprises two filter banks comprising at least one filter each, wherein the at least two filters of the two filter banks divide the frequency band to be digitized into the at least two sub-bands such that the sub-bands of the at least two filters of the two filter banks overlap partly.

4. The receiver in accordance with claim 1, wherein the filter unit comprises a total number of at least three filters for at least three receive paths so that the frequency band to be digitized is dividable into at least three sub-bands for the at least three receive paths.

5. The receiver in accordance with claim 4, wherein the at least three filters comprise such a filter characteristic that the change in filter bandwidth thereof is equal with +/−30%, wherein the center frequency of the respective bandwidth increases over the at least three filters of the filter bank.

6. The receiver in accordance with claim 3, wherein two filters in one of the two filter banks comprising directly successive center frequencies, with regard to the bandwidth, are configured such that the sub-bands of one of the two filter banks do not overlap, wherein a filter of the other one of the two filter banks, with regard to its center frequency, is located therebetween.

7. The receiver in accordance with claim 1, wherein the relative bandwidth is in a range from 1.4 to 1.6, and wherein the center frequency increases by a factor in the range from 1.2 to 1.4.

8. The receiver in accordance with claim 1, wherein the filter unit comprises an additional low-pass filter which, when compared to the at least two filters, comprises the lowest center frequency.

9. The receiver in accordance with claim 1, wherein the at least two filters of the filter unit comprise exclusively passive elements.

10. The receiver in accordance with claim 1, wherein the at least two filters of the filter unit and/or the two filter banks are connected to the common signal source via a common power divider.

11. The receiver in accordance with claim 1, wherein the at least two filters of the filter unit and/or the two filter banks are connected to a common antenna as a common signal source or are connected to the common antenna via a common power divider.

12. The receiver in accordance with claim 2, wherein the number of filters of the filter unit is selected such that the entire frequency band to be digitized is covered by the sub-bands.

13. The receiver in accordance with claim 1, wherein the digital signal processing comprises an FPGA.

14. The receiver in accordance with claim 1, wherein merging takes place in the digital signal processing in a lossless way.

15. The receiver in accordance with claim 1, wherein each of the at least two signal paths between the analog-to-digital converter and the respective filter comprises an automatic amplifier controller and/or an amplifier.

16. A method for receiving an analog signal comprising a frequency band to be digitized, comprising:
   dividing the frequency band to be digitized into at least two sub-bands by means of a filter unit comprising at least two filters for at least two receive paths, wherein the at least two filters are coupled to a common signal source in order to acquire the analog signal comprising the frequency band to be digitized;
   digitalizing, per receive path, the signals of the at least two sub-bands by means of an analog-to-digital converter per receive path; and
   merging the at least two digitalized signals by means of digital signal processing coupled to the at least two analog-to-digital converters of the at least two receive paths in order to acquire the at least two digitalized signals,
   wherein the at least two filters, with regard to their filter characteristics, are implemented such that the sub-bands comprise a mutual relative bandwidth of smaller than 1:2 so that the two filters are implemented with a change in filter bandwidth relative to the bandwidth of a neighboring filter of the at least two filters.

17. A non-transitory digital storage medium having stored thereon a computer program for performing a method for receiving an analog signal comprising a frequency band to be digitalized, comprising:

dividing the frequency band to be digitalized into at least two sub-bands by means of a filter unit comprising at least two filters for at least two receive paths, wherein the at least two filters are coupled to a common signal source in order to acquire the analog signal comprising the frequency band to be digitalized;

digitalizing, per receive path, the signals of the at least two sub-bands by means of an analog-to-digital converter per receive path; and merging the at least two digitalized signals by means of digital signal processing coupled to the at least two analog-to-digital converters of the at least two receive paths in order to acquire the at least two digitalized signals, wherein the at least two filters, with regard to their filter characteristics, are implemented such that the sub-bands comprise a mutual relative bandwidth of smaller than 1:2 so that the two filters are implemented with a change in filter bandwidth relative to the bandwidth of a neighboring filter of the at least two filters, when the program runs on a computer.

* * * * *